United States Patent [19]

Hisatomi et al.

[11] Patent Number: 4,588,473
[45] Date of Patent: May 13, 1986

[54] SEMICONDUCTOR WAFER PROCESS

[75] Inventors: Kiyoshi Hisatomi; Masaburo Iwabuchi, both of Yokohama, Japan

[73] Assignee: Tokyo Shibaura Denki Kabushiki Kaisha, Kawasaki, Japan

[21] Appl. No.: 536,263

[22] Filed: Sep. 27, 1983

[30] Foreign Application Priority Data

Sep. 28, 1982 [JP] Japan .................. 57-169105

[51] Int. Cl.⁴ .................. H01L 21/306; B44C 1/22
[52] U.S. Cl. .................. 156/645; 51/281 R; 156/636; 156/639; 156/662; 156/903
[58] Field of Search .......... 156/636, 639, 645, 651, 156/655, 657, 662, 903; 51/281 R, 281 SF, 317, 318, 323

[56] References Cited

U.S. PATENT DOCUMENTS 3,951,728  4/1976  Egashira et al. ........... 156/651 X

FOREIGN PATENT DOCUMENTS 53-38594  10/1978  Japan .
0113332   9/1980   Japan ................... 156/645
0121643   9/1980   Japan ................... 156/654

OTHER PUBLICATIONS

H. Nagai et al., "Semiconductor World", (1983), pp. 53-58.

Primary Examiner—William A. Powell
Attorney, Agent, or Firm—Schwartz, Jeffery, Schwaab, Mack, Blumenthal & Evans

[57] ABSTRACT

The edge part of a thin disc-shaped slice, i.e., wafer, transversely cut off a single-crystal semiconductor rod is bevel machine, and then the entire surface of this wafer is mirror finished. This mirror finish is obtained by carrying out chemical etching to the ordinary depth and then carryng out polishing by means of a polishing fabric. By this process, all surfaces of the semiconductor wafer are polished to a mirror finish, and the formation of dendrite crystals on any of the surfaces is inhibited.

5 Claims, 6 Drawing Figures

X 400

SEMICONDUCTOR WAFER PROCESS

BACKGROUND OF THE INVENTION

This invention relates generally to semiconductor wafers and more particularly to semiconductor wafers of silicon, sapphire, and gallium arsenide, to a process for producing the same, and to an apparatus for producing the same.

Semiconductor wafers for use in the manufacture of integrated circuits (IC) sometimes become chipped at their edges during handling. For this reason, it is the common practice to subject such wafers to beveling machining. By this beveling processing, chipping of the edges of semiconductor wafers due to their collision with some other objects can be prevented.

However, since no grinding or polishing whatsoever of the beveled surface is carried out, dendrite crystals are formed thereon. These crystals themselves break or cause breakage of other objects which they happen to contact to produce so-called dust such as silicon particles. Needless to say, such dust particles give rise to trouble in the production of semiconductor devices.

SUMMARY OF THE INVENTION

This invention has been devised with the aim of overcoming the difficulties encountered in the prior art as described above.

It is an object of this invention to provide semiconductor wafers affording an improvement in the yields in the production of electronic devices by preventing the formation of dendrite crystals on the beveled surfaces of semiconductor wafers and, furthermore, preventing contact between objects such as a carrier and the beveled surfaces by which contaminants such as dust particles of Si, SiN, and $SiO_2$ would otherwise be produced.

Other objects of the invention are to provide a process for producing these semiconductor wafers and to provide an apparatus for producing the same.

With the aim of achieving the foregoing objects, this invention, in one aspect thereof, provides a process which comprises, essentially, mechanically bevel machining the edge portion of each semiconductor wafer cut off from a single-crystal rod of a semiconductor and, moreover, producing a mirror finish on the beveled surfaces, similarly as also the other surfaces of the wafer, by buffing or by chemical polishing.

According to this invention in another aspect thereof, there is provided a semiconductor wafer produced in the above described manner and thereby having an edge part which has been beveled and then polished to a mirror finish.

This invention in still another aspect thereof provides an apparatus for producing semiconductor wafers comprising a rotating device for rotating a semiconductor wafer and a polishing device disposed in the vicinity of the rotating device and having polishing fabric for mirror finishing the edge part of said wafer thus rotated.

The nature, utility, and further features of this invention will be more clearly apparent from the following detailed description when read in conjunction with the accompanying drawings, briefly described below.

DETAILED DESCRIPTION OF THE INVENTION

Figure 4:
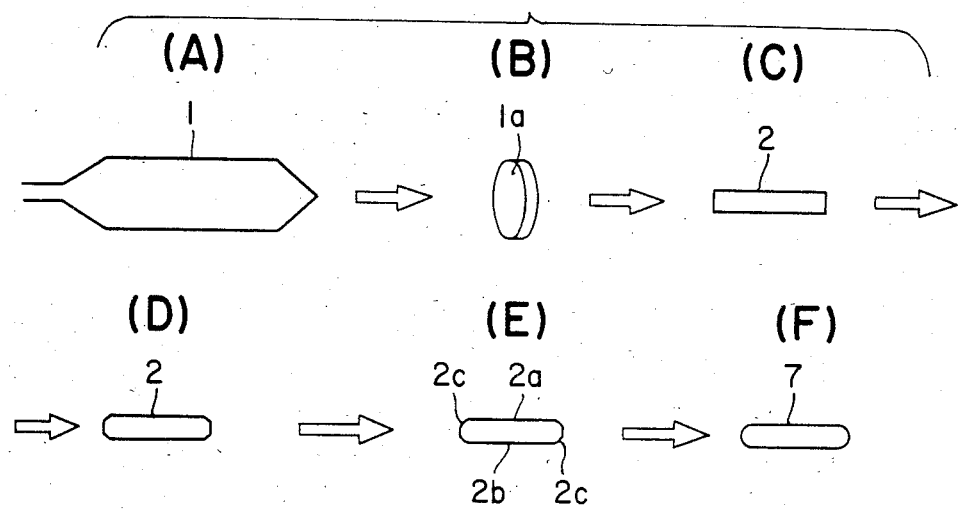
FIGS. 4A through 4F are parts of a schematic flowsheet indicating the sequence of process steps in a conventional process for producing semiconductor wafers.
Figure 5:
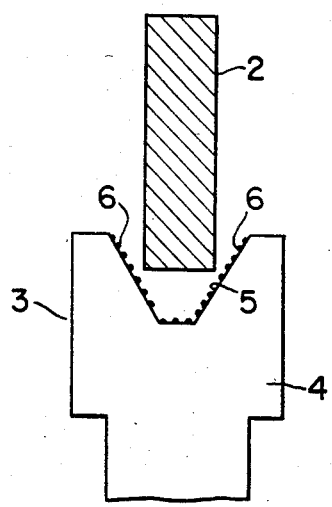
FIG. 5 is a view similar to FIG. 1 showing a conventional beveling apparatus.
Figure 6:
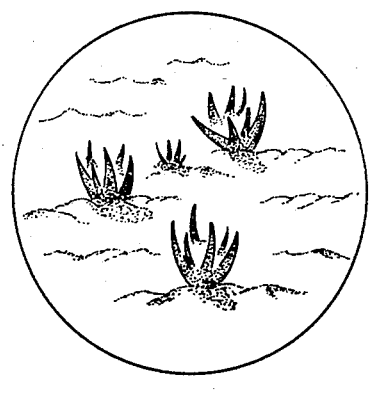
FIG. 6 is a drawing based on a photomicrograph, for a description of dendrite crystals formed on the beveled surface of a semiconductor wafer.

As conducive to a full understanding of this invention, a brief description of the prior art with reference to FIGS. 4, 5, and 6 will first be presented.

Semiconductor wafers, which are materials for fabricating integrated circuits such as a large scale integrated (LSI) circuit are, in general, produced in a process sequence as indicated in FIG. 4.

In this common process, a single crystal rod of a material such as silicon as indicated in FIG. 4A is cut transversely by means such as a diamond cutter into slices 1a as shown in FIG. 4B. Each of these slices 1a then undergoes lapping and becomes a wafer 2 as shown in FIG. 4C. Each wafer 2 is then subjected to beveling of its edges as indicated in FIG. 4D.

This beveling is carried out mechanically by means of a beveling apparatus 3 as shown in FIG. 5. The essential parts of this beveling apparatus 3 are a base head 4 made of a metal such as stainless steel or nickel and having at its upper part a recess 5 with sloping opposite sides corresponding to the desired bevel surfaces of the wafer 2, diamond particles 6, 6, . . . , 6 bonded onto the inner surface of the recess 5 by nickel plating to form an abrasive surface of a particle roughness of the order of 50 to 100 mesh, and means (not shown) for rotating each wafer 2 relative to this abrasive surface as indicated in FIG. 5.

After the above described beveling step, the opposite faces 2a and 2b and the beveled surface 2c as shown in FIG. 4E of the wafer 2 are all chemically treated, that is, etched, by a liquid such as a mixture of nitric acid and hydrofluoric acid thereby to remove imperfections such as cutting marks and make these surfaces smooth. Then, as shown in FIG. 4F, only the opposite faces 2a and 2b are mirror finished to prepare a semiconductor wafer 7 to be supplied to a subsequent electronic device production process.

As described above, in the prior art, chipping and breakage of wafer edge parts at the time of fabrication of wafers and semiconductor devices have been reduced by beveling the edge parts of these wafers, thereby improving the wafer fabrication yield and the yield of devices produced therefrom.

A conventional wafer, however, is not subjected to mirror finishing of its beveled surface after the beveling step but is ground with a grinding wheel or abrasive wheel, then chemically etched, and left in that state. For this reason, concavities and convexities, or irregularities, and an abraded layer remain. When this wafer is subjected to an ordinary process for producing semiconductor devices such as, for example, formation of an oxide film and then a step of deposition of silicon nitride or polysilicon, dendrite crystals of silicon nitride or the like as shown in FIG. 6 are formed on the beveled surface in some instances.

During a device producing process, such dendrite crystals become pulverized upon contacting objects such as a carrier, an operative jig, or a quartz member. Furthermore, when $SiO_2$ constituting a substrate is etched, a portion thereof breaks off to become fine particles. These particles adhere to the wafer surface and give rise to a lowering of the yield in the production of devices. Even in the case where the dendrite crystals do not grow, the beveled part of the wafer during the device production process contacts objects such as a carrier, an operative jig, or a quartz member, and dust particles such as those of Si, SiN, and $SiO_2$ are formed.

Figure 1:
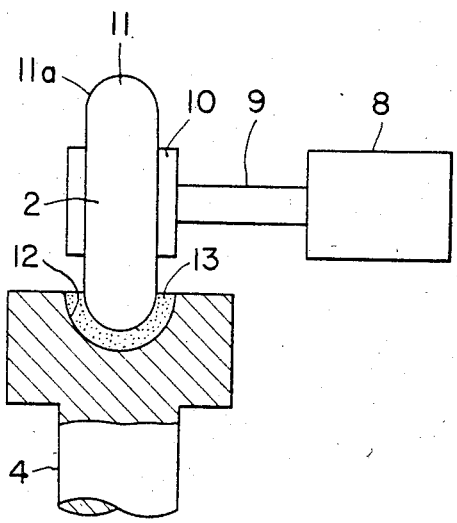
FIG. 1 is a view showing one example of an apparatus for producing semiconductor wafers according to this invention, the view being in a direction parallel to the plane of a wafer being polished.

This invention seeks to overcome the above described difficulties. In one example of an apparatus for producing semiconductor wafers according to this invention, as shown in FIG. 1, a motor 8 rotates a rotating spindle 9 coupled to its outer end to a wafer fixing jig 10 for fixedly holding a semiconductor wafer 2 which has undergone edge-beveling machining and chemical etching. A base head 4 for polishing is so positioned that a recess 12 formed therein is confronting the edge part 11 of the wafer 2 an aligned state. A buffing or polishing fabric 13 for mirror-like finishing is bonded to the inner surface of the recess 12.

The wafer 2, which has been chemically etched or chemically polished to a degree which has not reduced its wafer material very much, more specifically, to a degree of the order of $60\mu$, still has minute concavities and concavities, or irregularities, and an abraded layer on its edge part 11. These irregularities are removed by running the motor 8 thereby to drive the wafer 2 in rotation and bringing the polishing fabric 13 into contact with the edge part 11 of the wafer 2, whereby the beveled surface 11a of the edge part 11 becomes a smooth mirror-like surface.

Figure 2:
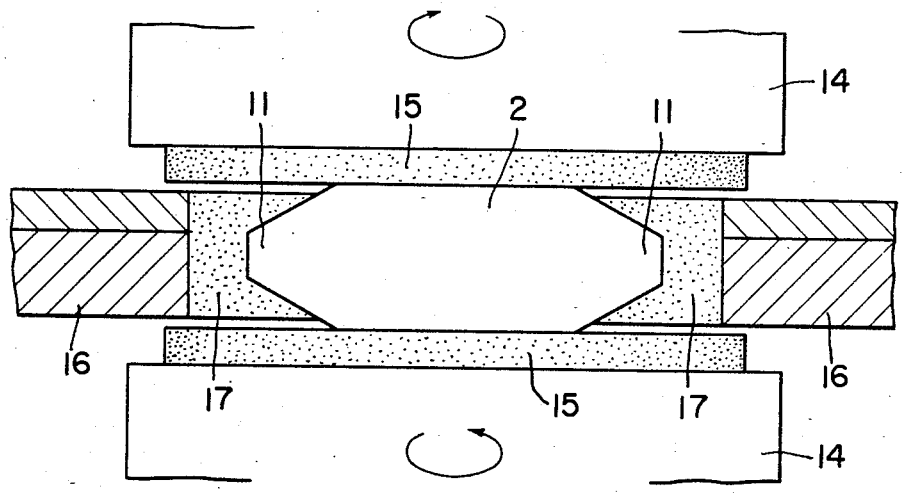
FIG. 2 is a view showing another embodiment of the invention.

In another example of the apparatus of this invention, as illustrated in FIG. 2, rotational movement is produced by a pair of coaxially-opposed, counterrotating turntables 14, 14. Pieces of polishing fabric 15, 15 for mirror-finishing are bonded respectively onto the mutually opposed surfaces of the turntables 14,14. A wafer 2 to be polished is interposed between and in contact with the pieces of polishing fabric 15, 15. Between the turntables 14, 14 are disposed mutually opposed carriers 16, 16, to the opposed end parts of which pieces of polishing fabric 17, 17 are respectively bonded to enwrap the edge part 11 of the beveled semiconductor wafer 2 with these polishing fabric pieces 17, 17.

With the semiconductor wafer 2 thus held between the pieces of polishing fabric 15, 15 and 17, 17, the turntables 14, 14 are rotated at respectively different speeds while the carriers 16, 16 and their polishing fabrics 17, 17 are held stationary. The wafer 2 is thereby caused to rotate relative to all pieces of polishing fabric 15, 15 and 17, 17, whereby its two faces and its edge part 11, that is, its entire surface, is mirror polished in a single process step.

As a modification of the above described example, the carriers 16, 16 may be adapted to be rotatable about the wafer 2.

Figure 3:
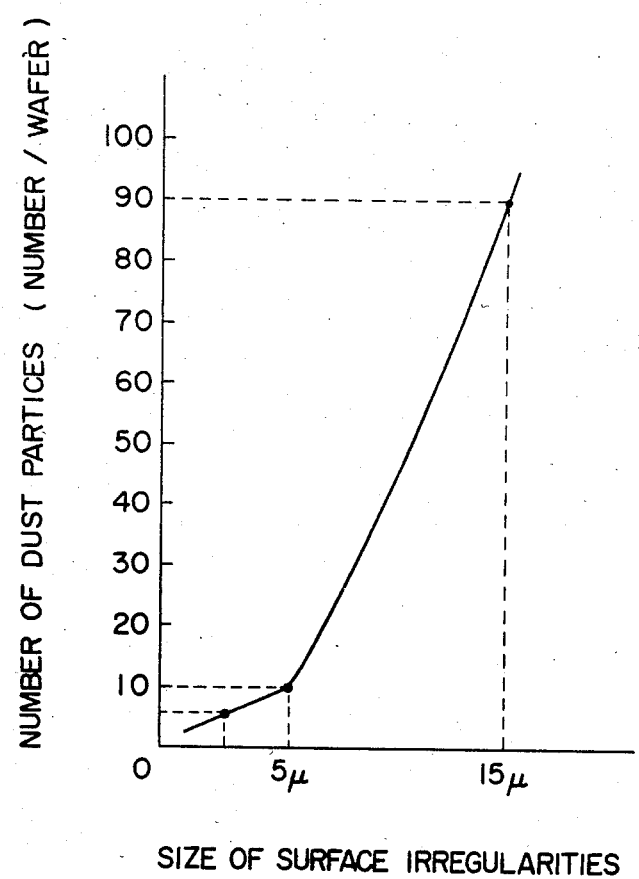
FIG. 3 is a graph indicating the relationship between the degree of polishing of the surface of a semiconductor wafer and the number of dust particles produced.

FIG. 3 is a graph indicating the relationship between the degree of polishing of the surfaces of a semiconductor wafer and the number of dust particles produced.

More specifically, by polishing the surfaces of a semiconductor wafer, the size of the surface irregularities is reduced. When the dimensions of individual surface irregularities were measured, it was found that with a maximum diametrical dimension thereof of the order of $5\mu$ as a critical value, the number of dust particles produced varies greatly, that is, increases greatly for greater diameters.

The number of dust particles produced when the surface irregularities are of $5-\mu$ diameter is 10 per wafer in the case of a wafer of 100-mm diameter, as shown in FIG. 3. By further polishing to cause the surface to approach a mirror surface, the number of dust particles is further reduced. On the other hand, when the diameter of the surface irregularities exceeds $5\mu$, the number of dust particles abruptly increases. In the case of a conventional wafer without a polished surface, the diameter of the surface irregularities is of the order of $15\mu$, and the number of dust particles is of the order of 90 per wafer.

It has been verified by experiments that dendrite crystals are not formed on the beveled surface of a semiconductor wafer mirror polished in the above described manner at the time of evaporation deposition of silicon nitride or polysilicon.

As will be apparent from the foregoing description, because the semiconductor wafer according to this invention is mirror finished even over its beveled surface, chipping and breakage of its edge part at the time of fabrication of the wafer and of a device therefrom are prevented. Moreover, at the time of deposition of silicon nitride or polysilicon, the growth of dendrite crystals on the beveled surface is inhibited. Furthermore, fine particles of Si, SiN, and the like of irregularities are not produced in a subsequent device fabrication process, whereby a high yield in the production of devices can be obtained.

Thus, by the practice of the production process with the apparatus according to this invention, the above described semiconductor wafer can be produced in a high yield by merely bonding pieces of polishing fabric to parts such as a base head, turntables, carriers and.

What is claimed is:

1. A process for producing semiconductor wafers which comprises transversely cutting off thin slices from a single-crystal semiconductor rod thereby to obtain wafers, bevel machining the edge part of each wafer, chemically machining the entire surface of the wafer, and polishing the beveled edge part to a mirror finish.

2. A process for producing semiconductor wafers according to claim 1 in which sai dchemical machining is carried out by immersing the wafer in a chemical etchant.

3. A process for producing semiconductor wafers according to claim 1 in which said chemical machining is carried out to a depth of 60 microns.

4. A process for producing semiconductor wafers according to claim 1 in which said polishing is carried out by rubbing the beveled edge part of the wafer with a polishing fabric.

5. A process for producing semiconductor wafers according to claim 1 in which said polishing is carried out by moving a polishing fabric with respect to the wafer so as to rub the beveled edge part of the wafer.

* * * * *